US007250576B2

(12) United States Patent
Colgan et al.

(10) Patent No.: US 7,250,576 B2
(45) Date of Patent: Jul. 31, 2007

(54) CHIP PACKAGE HAVING CHIP EXTENSION AND METHOD

(75) Inventors: Evan G. Colgan, Chestnut Ridge, NY (US); David L. Edwards, Poughkeepsie, NY (US); Benjamin V. Fasano, New Windsor, NY (US); Kamal K. Sikka, Poughkeepsie, NY (US); Jeffrey A. Zitz, Poughkeepsie, NY (US); Wei Zou, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,615

(22) Filed: May 19, 2005

(65) Prior Publication Data

US 2006/0261467 A1 Nov. 23, 2006

(51) Int. Cl.
*H05K 1/16* (2006.01)
(52) U.S. Cl. .................... 174/260; 174/252; 257/707
(58) Field of Classification Search ................ 174/260, 174/252; 361/704, 705, 706, 709, 710, 713, 361/718; 257/706, 707, 710, 712, 713, 730
See application file for complete search history.

(56) References Cited

U.S. PATENT DOCUMENTS 5,109,318 A    4/1992   Funari et al.
5,901,048 A    5/1999   Hu
5,909,056 A *  6/1999   Mertol .................. 257/704
6,011,697 A    1/2000   Budnaitis et al.
6,020,637 A *  2/2000   Karnezos ................ 257/738
6,160,718 A   12/2000   Vakilian
6,188,579 B1   2/2001   Buondelmonte et al.
6,597,575 B1 * 7/2003   Matayabas et al. ......... 361/705
6,757,170 B2 * 6/2004   Lee et al. ................ 361/704
7,002,804 B2 * 2/2006   Chung et al. ............. 361/704
7,005,749 B2 * 2/2006   Hsu et al. ................ 257/778
2004/0113259 A1* 6/2004  Prior ..................... 257/698
2006/0042825 A1* 3/2006  Lu et al. .................. 174/252
2006/0214286 A1* 9/2006  Sir et al. ................ 257/720

* cited by examiner

*Primary Examiner*—Ishwar (I. B.) Patel
(74) *Attorney, Agent, or Firm*—Joseph Petrokaitis; Hoffman, Warnick & D'Alessandro (57) ABSTRACT

A chip package including a chip extension for containing thermal interface material (TIM) and improves chip cooling, and a related method, are disclosed. In particular, the chip package includes a chip, a cooling structure coupled to the chip via a TIM, and a chip extension may be thermally coupled to an outer edge of the chip. A TIM placed between the chip and the cooling structure is contained during thermal cycling by the chip extension such that void formation at the edge of the chip, which can move between the chip and cooling structure, is suppressed. The chip extension also improves lateral heat dissipation by providing a greater thermal contact area between the cooling structure and the chip and, if needed, the substrate at a much lower cost than using larger die with lower production unit output from a wafer.

12 Claims, 7 Drawing Sheets

CHIP PACKAGE HAVING CHIP EXTENSION AND METHOD

BACKGROUND OF THE INVENTION

1. Technical Field

The present invention relates generally to chip packages, and more particularly, to a chip package including a chip extension for containing thermal interface material and improving chip cooling.

2. Related Art

The drive for increasing chip performance (higher operating frequencies) is resulting in increased chip power, and the reduction of circuit size is increasing chip power density. Chip leakage power is aggravated by shrinking device size, and is strongly affected by operating temperature. As a result, as chips continue to become smaller, there is a need to continue enhancing chip cooling capability.

Figure 1:
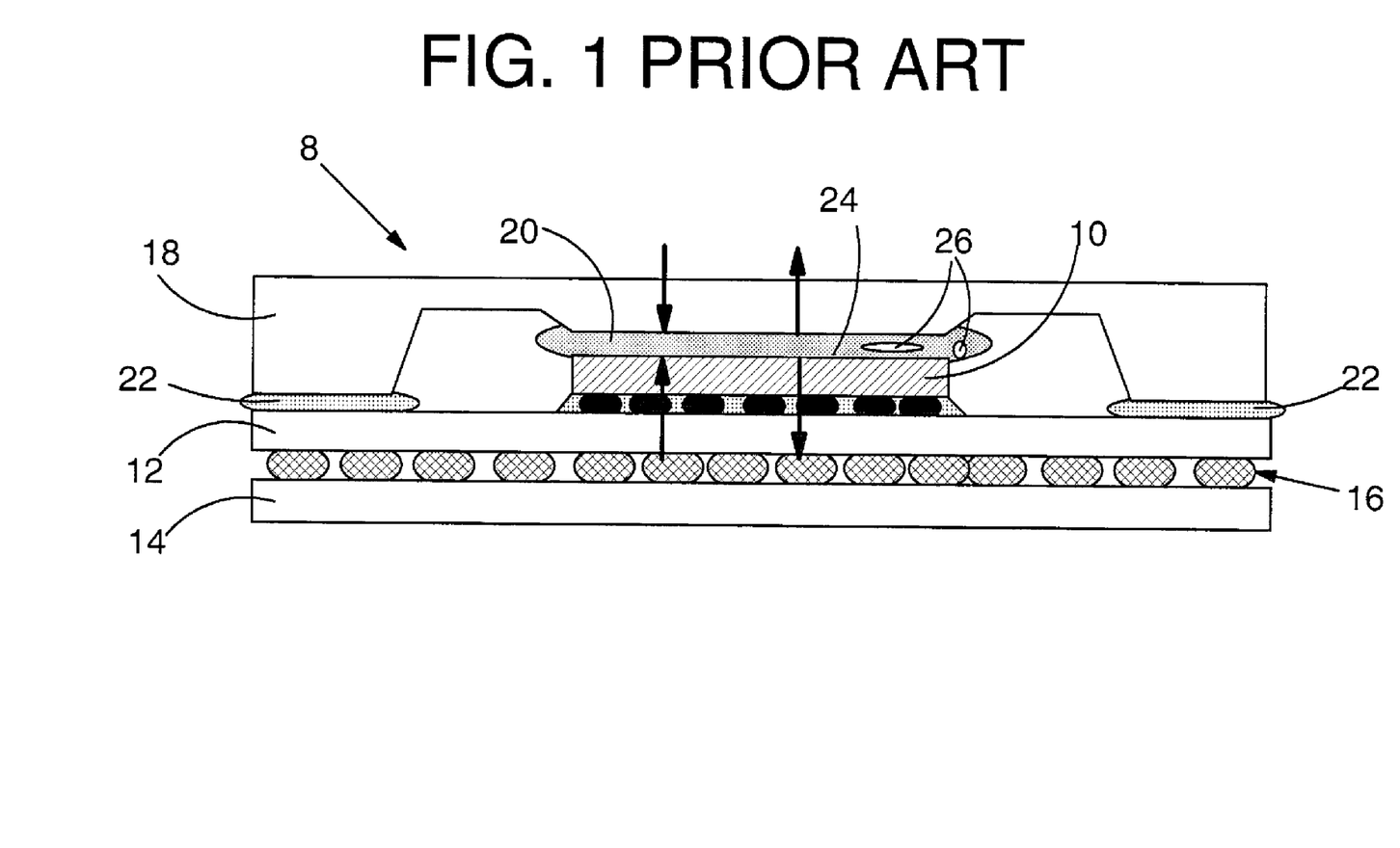
FIG. 1 shows a prior art chip package including voids created by thermal cycling.

One common cooling mechanism is to thermally connect chips to a cooling structure, such as a lid or heat sink, via a thermal interface material (TIM). Commonly used TIMs include thermal pastes, thermal adhesives, and phase change materials; and less commonly used TIMs include liquid metals and solders. FIG. 1 shows an illustrative chip package 8 including a chip 10 coupled to a substrate 12, which is in turn coupled to a card 14 via a conventional grid array 16. A cooling structure 18 is thermally coupled by a TIM 20 to chip 10, and cooling structure 18 is coupled to substrate 12 via polymer adhesive 22. In this example, cooling structure 18 is in the form of a lid.

There is a need to improve the reliability of cooling structures 18 that utilize compliant TIMs 20 (i.e., thermal paste). One problem with conventional structures is caused by the relatively high viscosity of high performance thermally conductive pastes. High performance thermal pastes are designed to have high viscosity at elevated temperature to prevent the materials from readily flowing (i.e., sagging) off of chip 10 during normal operation. The high viscosity is also due to their high solids loading, which enhances thermal performance. Unfortunately, the high viscosity also results in "paste pumping," which refers to the situation in which the TIM is pumped into and out of the gap between chip 10 and cooling structure 18. In particular, as shown by the arrows in FIG. 1, as power is applied to and removed from chip 10, package 8 heats and cools, i.e., it thermally cycles. During these thermal transients there is often relative movement of cooling structure 18 toward and away from back side 24 of chip 10. This movement is caused by the materials coefficient of thermal expansion and temperature differences that arise during device operation. When cooling structure 18 moves toward back side 24 of chip 10, the space for TIM 20 above chip 10 decreases and some of the paste is squeezed out the side of the gap between chip 10 and cooling structure 18. When cooling structure 18 and chip 10 move in opposite directions, i.e., away from one another, the gap increases. As the gap increases, surplus TIM 20 from around the gap flows back into the gap, maintaining the thermal integrity of the structure, while entrapped gas, typically ambient air, can enter the paste. Air moving into the gap tends to form pockets referred to as voids 26. These voids 26 have much lower thermal conductivity than TIM 20, causing chip 10 temperature to rise, and further increasing power dissipation, usually because of device leakage current. These voids 26 tend to grow with additional cycling, further degrading the cooling, degrading device reliability, and increasing the power consumption.

Another problem with conventional structures is that, in most high power flip chip packages, device cooling by heat transfer to and through substrate 12 is nearly negligible. As a result, virtually all the heat must be removed from a back side 24 (non-circuit side) of chip 10. Semiconductor devices are produced in massive quantities on a single wafer. Typically, a prototype device design is produced in a die size that is later reduced in size to increase the number of devices on a processed wafer. This chip 'shrink' increases the density of the power on the device since the body size is physically smaller for the same power consumption. Silicon used for devices has good thermal conductivity and will spread the heat created by the active devices to the backside of the die as well as laterally across the die surface. Specific regions of the device can become much hotter, often because these regions are where the die cores are located. Initial builds of devices on large die have the advantage of providing lateral heat spreading from these 'hot spots'. Thus, decreasing the die size improves the die count on each wafer but also reduces the lateral heat spreading of the silicon.

In view of the foregoing, there is a need to contain TIMs when the cooling structure separates during thermal cycling, and to improve lateral heat transfer from the chip to reduce the heat flux without impacting the number of die that can be produced on a wafer.

SUMMARY OF THE INVENTION

The invention includes a chip package including a chip extension for containing thermal interface material (TIM) and improving chip cooling, and a related method. In particular, the chip package includes a chip, a cooling structure coupled to the chip via a TIM, and a chip extension, which may be thermally coupled to an outer edge of the chip. A TIM placed between the chip and the cooling structure is contained during thermal cycling by the chip extension such that void formation at the edge of the chip, which can move between the chip and cooling structure, is suppressed. The chip extension also improves lateral heat dissipation by providing a greater thermal contact area between the cooling structure and the chip and, if needed, the substrate at a much lower cost than using larger die with lower production unit output from a wafer.

A first aspect of the invention is directed to a chip package comprising: a chip; a cooling structure coupled to the chip via a thermal interface material; and a chip extension thermally coupled to at least one outer edge of the chip.

A second aspect of the invention includes a chip package comprising: a substrate; a chip mounted to the substrate; a cooling structure coupled to the chip via a thermal interface material; and a thermally conductive chip extension thermally coupled to at least one outer edge of the chip and to the substrate, the chip extension also thermally coupled to the cooling structure via the thermal interface material.

A third aspect of the invention is related to a method of containing a thermal interface material in a chip package during thermal cycling and improving heat dissipation, the method comprising the steps of: providing a chip extension adjacent to the chip; and placing the thermal interface material between a cooling structure and the chip and the chip extension, whereby the chip extension contains the thermal interface material during thermal cycling and provides a thermal contact area between the cooling structure and the chip.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 2:
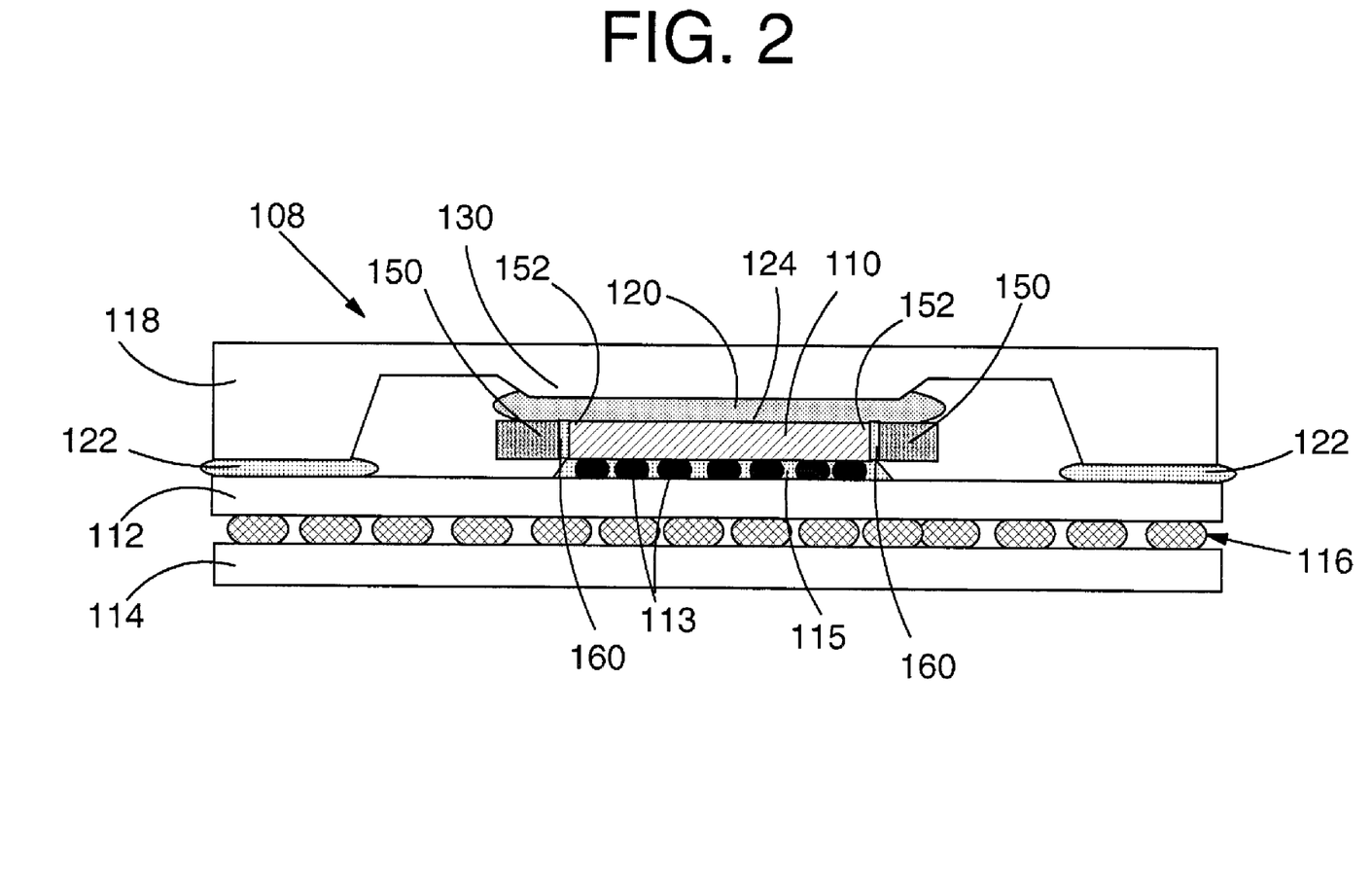
FIG. 2 shows one embodiment of a chip package according to the invention.

The invention includes a chip package including a chip extension that contains thermal interface material (TIM) and improves chip cooling, and a related method. With reference to the accompanying drawings, FIG. 2 shows one embodiment of a chip package 108 according to the invention. Chip package 108 includes a chip 110 electrically connected to a substrate 112 by solder connections 113 and under-fill material 115. Substrate 112 is in turn electrically connected to a card 114 via a conventional grid array 116, e.g., ball grid array (BGA), column grid array (CGA), land grid array (LGA) or pin grid array (PGA). A cooling structure 118 is thermally coupled by a TIM 120 to chip 110 to provide a thermal path from the chip to cooling structure 118. TIM 120 may include any now known or later developed thermal interface material such as a thermal paste, liquid, phase change material and other materials. Cooling structure 118 is also coupled to substrate 112 via a conventional adhesive 122, e.g., a polymer or solder. In the embodiment illustrated, cooling structure 118 is in the form of a lid, but it could be any other conventional structure such as a heat sink or heat spreader. Likewise, although an adhesive 122 is shown between lid 118 and substrate 112, an elastomeric gasket, O-ring, metal seal or similar contact configuration can be used, for instance, held in place between the lid and substrate 112 by an externally applied compressive load.

In order to improve the reliability of TIM 120 in cooling structure 108, that utilizes compliant TIMs (i.e., thermal paste), the invention includes a chip extension 150 thermally coupled to at least one outer edge 152 of chip 110. "Thermally coupled" indicates that heat can be transferred from chip 110 to chip extension 150, either directly or indirectly. Chip extension 150 is also coupled to cooling structure 118 via TIM 120. In one embodiment, chip extension 150 includes silicon, copper, aluminum, copper-molybdenum, graphite, aluminum-silicon-carbide, tungsten carbide, aluminum nitride, beryllia, or diamond based composites, such that it is thermally conductive. As a result, chip extension 150 also provides an additional thermal path from chip 110 to cooling structure 118 and thus improves chip cooling while not degrading the main thermal path through a back side 124 (non-circuit side) of chip 110. In addition, chip extension 150 may also enlarge the thermal path from back side 124 of chip 110 to cooling structure 118. Chip extension 150 may also prevent hot spots within chip 110, especially if the maximum power is near outer edge 152 of chip 110. As a result of the improved cooling, chip 110 can operate at higher frequencies/power with improved reliability. It should be recognized, however, that where the additional thermal path or enlarged path is not desired, chip extension 150 does not need to be thermally conductive. In this case, chip extension 150 enhances thermal reliability by facilitating the flow of the TIM back into the gap above the chip, to reduce the potential of void formation during thermal cycling of the assembly.

In any event, chip extension 150 extends laterally away from chip 110 such that it creates an apparent increase in chip 110 size, moving the origin of the entrapped air further away from the hot spots of chip 110. Accordingly, chip extension 150 aids in containing TIM 120 in a larger area gap, and especially high viscosity TIMs, between chip 110 and cooling structure 118. Cooling structure 118 may include an enlarged pedestal 130 to accommodate chip extension 150, however, this may not be necessary in all cases. In operation, chip extension 150 prevents formation of voids 26 (FIG. 1) in TIM 120, thus ensuring better thermal conductivity over the lifetime of operation. As illustrated, in one embodiment, an adhesive 160 fills a region between chip 110 and chip extension 150, and may provide thermal coupling between chip 110 and chip extension 150. Adhesive 160 can be thermally conductive if desired to transfer heat from chip 110 to chip extension 150. Typical thermally conductive materials for adhesive 160 may include, for example, silver or aluminum filled epoxies, low and high temperature solders, filled silicone rubbers and other commercially available materials. It should be recognized that the size of the region between chip 110 and chip extension 150 may vary such that chip extension 150 is fairly close to chip 110 or relatively distant from chip 110. In the latter case, a moat of adhesive 160 would exist between chip 110 and chip extension 150. Depending on the application and material for extension attachment, a very small gap would be desirable for minimal thermal resistance at this interface, while creating an extension to only reduce paste voiding, the gap can be larger since the feature is mainly a mechanical join. Thus, the gap can range from less than one mil to perhaps as much as 50 mils or more, respectively. If an electrically conductive adhesive is used and solder connections 113 on chip 110 underside could potentially be shorted by adhesive bridging between contacts, chip 110 can have an electrically insulating underfill 115 or a barrier of insulating materials can be created around chip 110 to prevent electrically conductive adhesive intrusion.

Figure 3A:
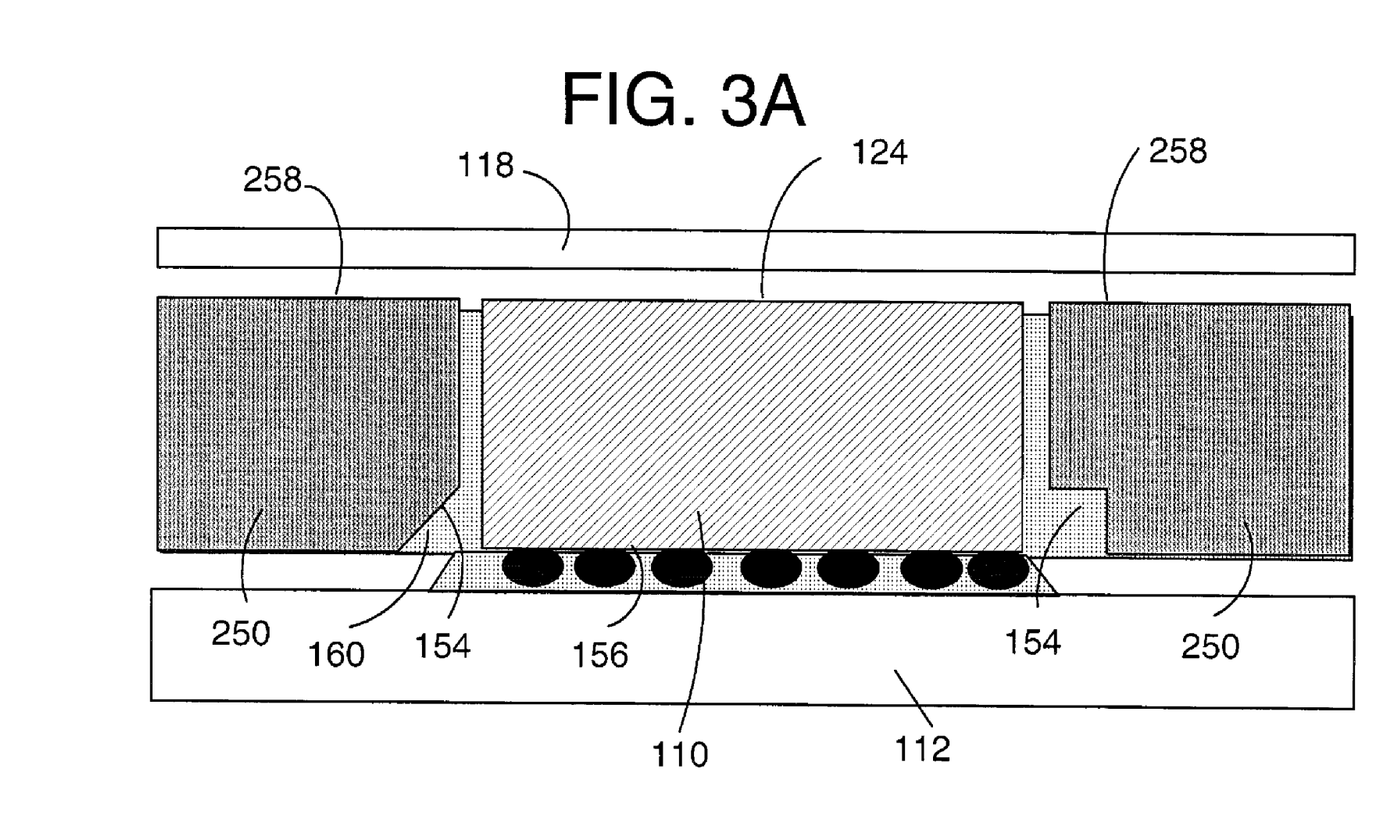
FIGS. 3A-B show a detail of alternative embodiments of a chip extension according to the invention.
Figure 3B:
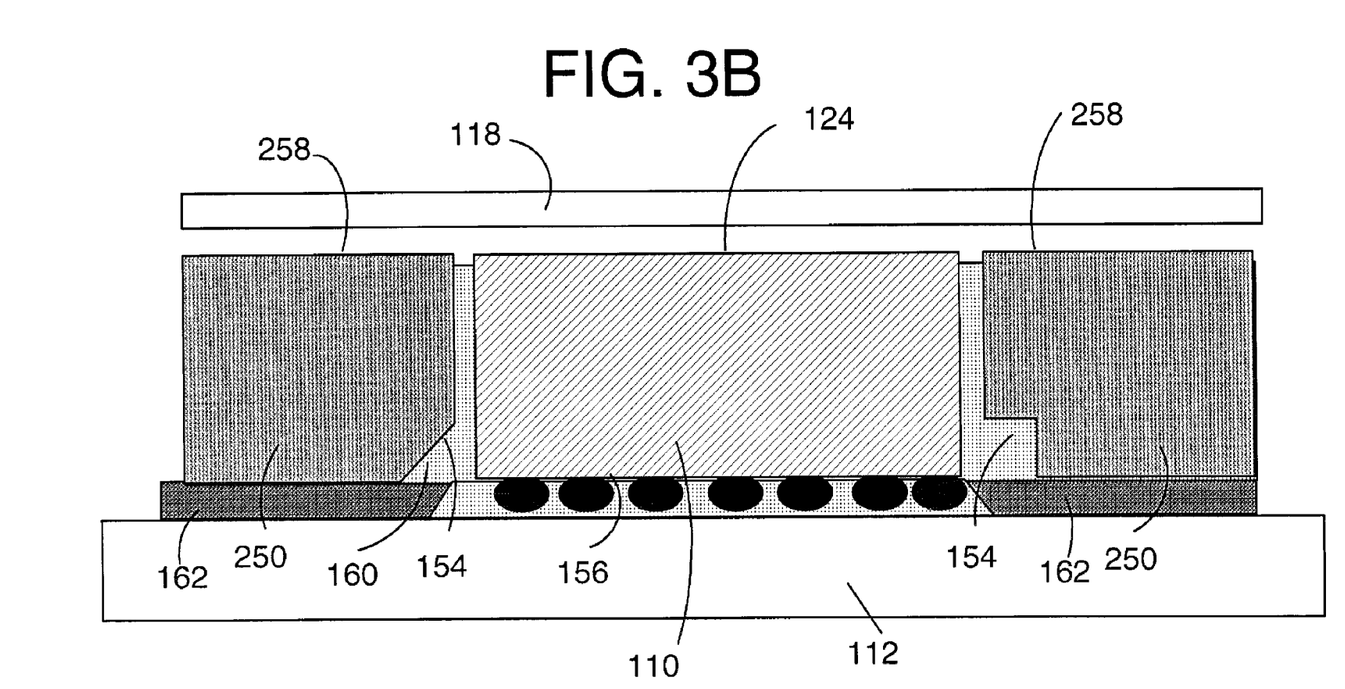

Chip extension 150 may include a variety of alternative shapes and structures as shown, for example, in enlarged FIGS. 3A-B, 4A-B and 5A-D. FIGS. 3A-B show a detail of a chip extension 250 according to one embodiment. In particular, chip extension 250 may include a shape feature 154 adjacent to a lower surface 156 of chip 110 to prevent dislocation of chip extension 250 during thermal cycling. Shape feature 154 may have, for example, a tapered chamfer shape (left side FIGS. 3A-B), a notched step shape (right side of FIGS. 3A-B) or any other shape useful for reducing stresses that may arise during adhesive or component joining or thermal cycling. As also illustrated in FIGS. 3A-B, chip 110 and chip extension 250 can have co-planar surfaces 124 and 258, respectively, adjacent to cooling structure 118 (only a portion shown and TIM not shown). FIG. 3A does not include underfill under chip extension 250, while FIG. 3B shows an underfill material 162, which may be different than adhesive 160. An underfill material 162 can be introduced under chip extension 250 to either support the chip extension during assembly to cooling structure 118 or provide additional heat transfer to substrate 112. The chip extension underfill material 162 can be thermally conductive or thermally insulative.

Figure 4A:
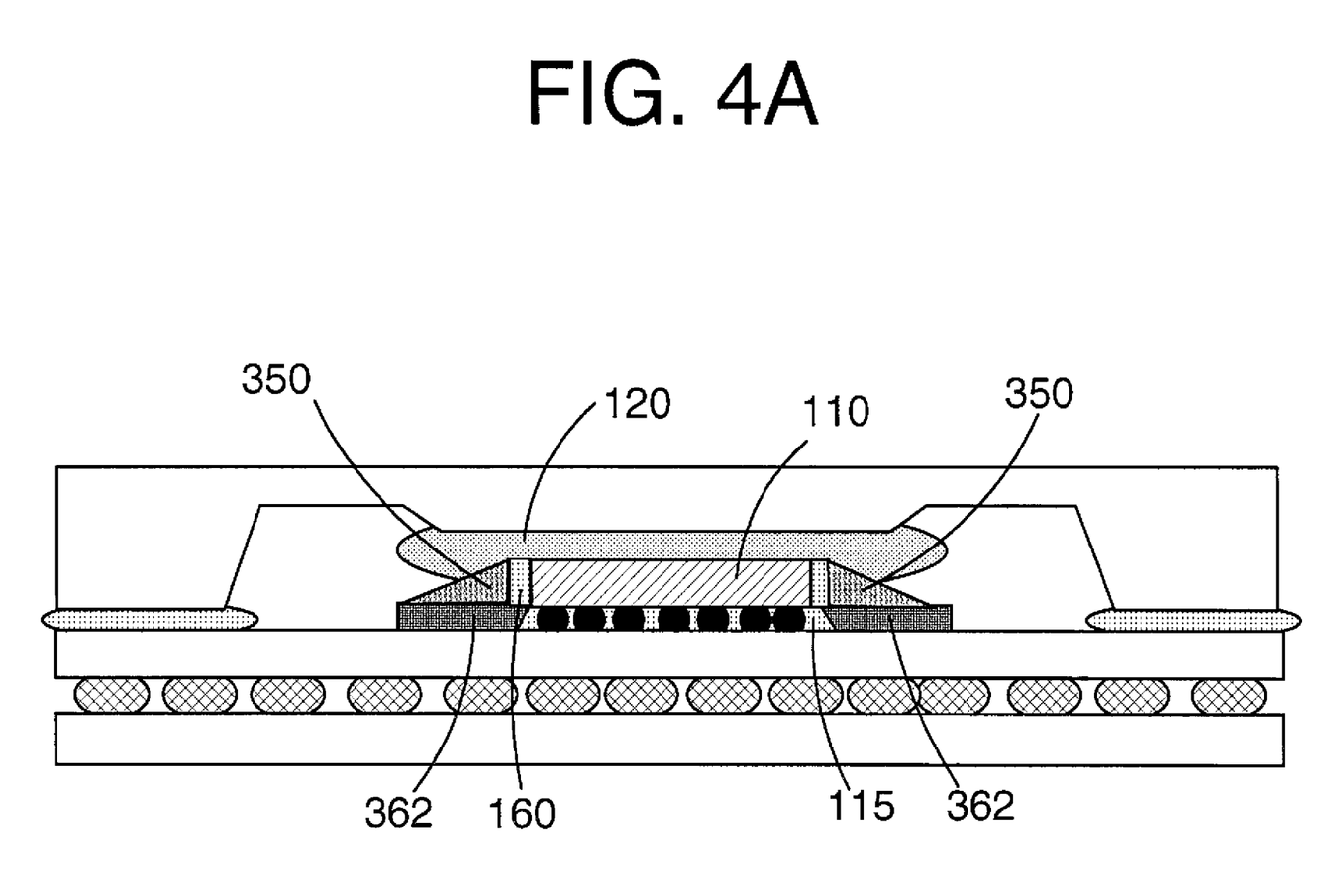
FIGS. 4A-B show alternative embodiments of a chip extension according to the invention.
Figure 4B:
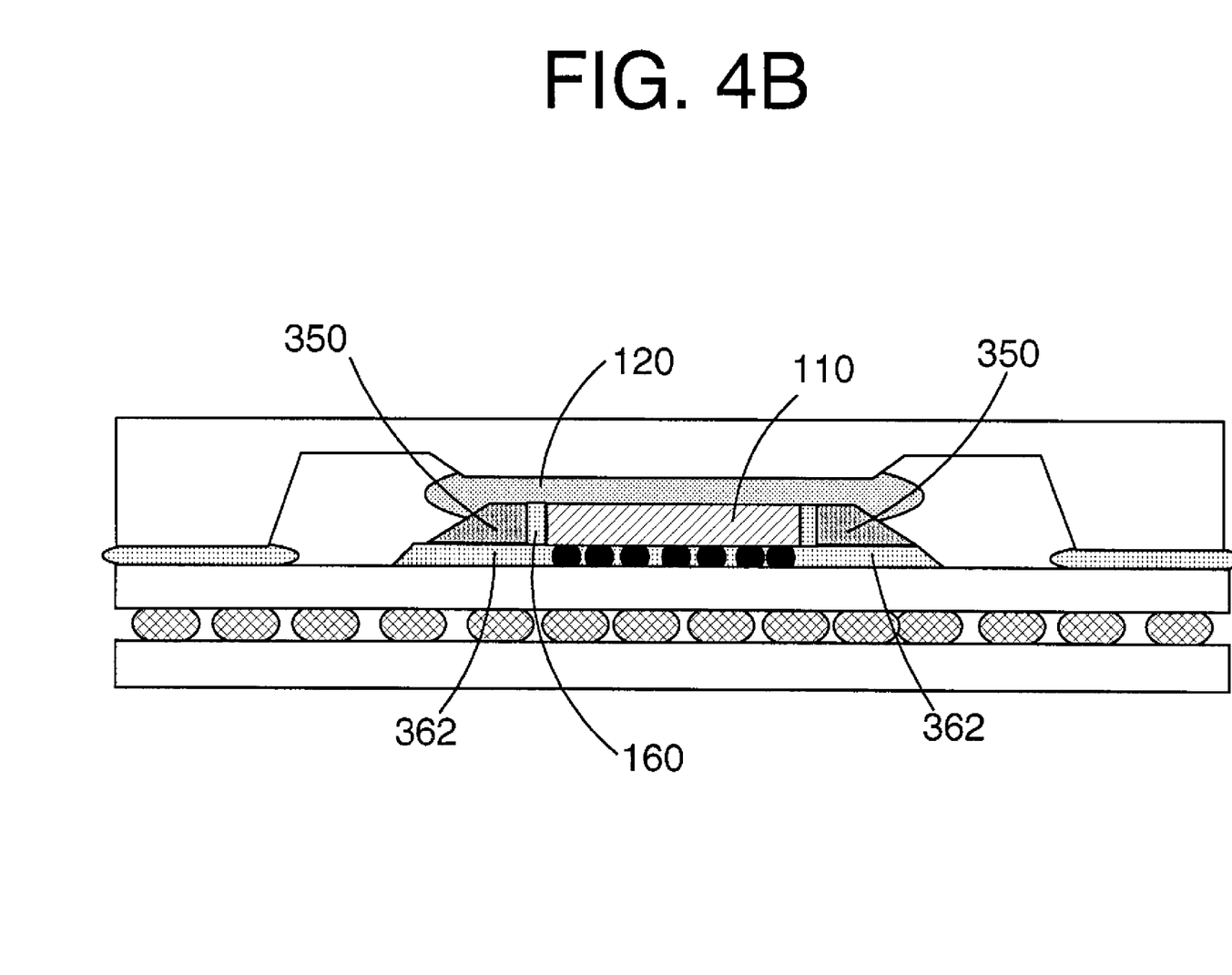

FIGS. 4A-B show various alternative embodiments of a chip extension 350 in which the chip extension may be ramped or tapered as it extends away from chip 110 to minimize stresses at abrupt edge discontinuities that can form voids. This ramped or tapered edge also allows for more TIM 120 volume capacity. Although, only a substantially triangular (FIG. 4A) and substantially trapezoidal shape (FIG. 4B) have been illustrated, the ramp may take a variety of other forms, e.g., curvilinear. FIGS. 4A-B both show an underfill material 362 introduced under chip extension 350 to either support the chip extension during assembly to cooling structure 118 or provide additional thermal transfer to substrate 112. The chip extension underfill material 362 can be thermally conductive or thermally insulative. In FIG. 4A, underfill material 362 under chip extension 350 is different than adhesive 160 or underfill 115.

Figure 5A:
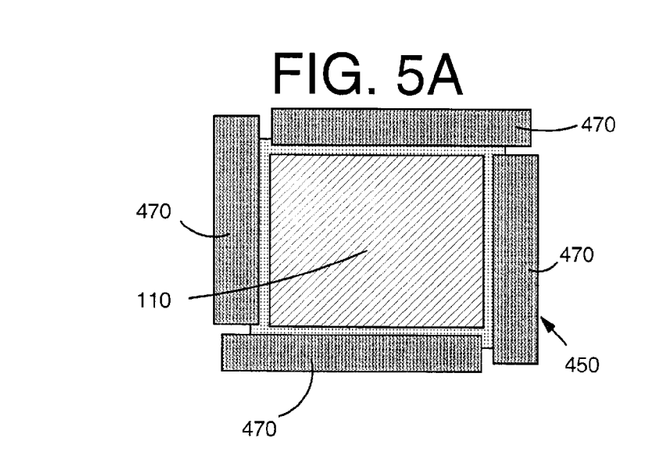
FIGS. 5A-D show plan views of alternative embodiments of a chip extension according to the invention.
Figure 5B:
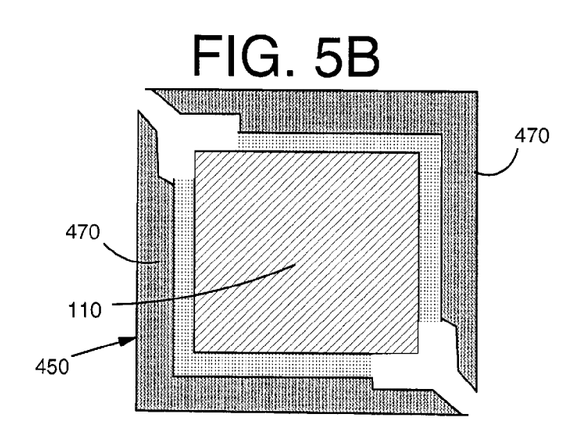
Figure 5C:
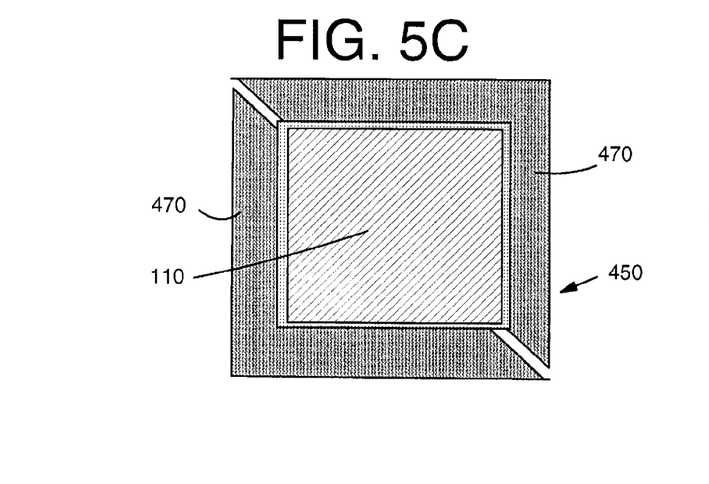
Figure 5D:
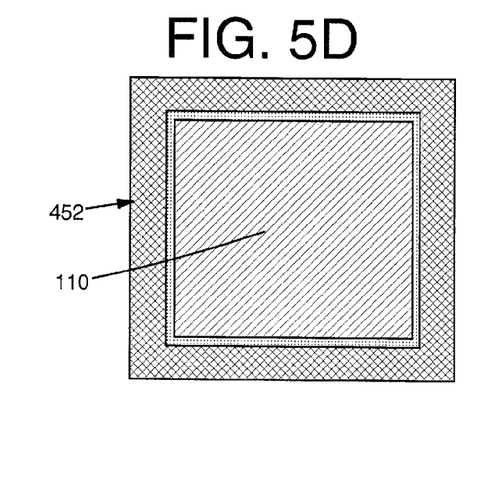

FIGS. 5A-C illustrate plan views of chip 110 and various embodiments of chip extensions 450 that include at least two discontinuous portions 470. Chip extensions 450 are shown as segments since this would be the most economical usage of highly thermal conductivity materials. If chip 110 is to be underfilled, openings at the corners of the extensions can be provided to allow access to the corners of chip 110 for underfill introduction. As shown in FIG. 5D, if desired, a full 'picture frame' 452 extension shape can also be used and the spacing between chip 110 and chip extension 450 adjusted to maximize the gap for adhesive filling or minimize it for better heat conduction. It should be recognized that the various embodiments described above may be combined in any desired fashion.

In one embodiment, the attachment of the chip extension (s) would be accomplished after chip 110 has been attached. Ideally, the chip extension is attached to chip 110 outer edges to produce coplanar surfaces with back side 124 of chip 110. One method to accomplish this would include attachment of the chip extension to a chip that has been turned upside down on a non-stick flat support surface. With back side 124 of chip 110 on the surface, at least one of the outer edges of chip 110 could be coated with adhesive and the chip extensions driven against the chip outer edges to create the desired gap. After curing the chip extension assembly would be removed from the support surface. As described above, if desired, an underfill material 162, 362 can be introduced under the chip extension to either support the chip extension during assembly to cooling structure 118 or provide additional thermal transfer to substrate 112. This feature can be introduced during or after the chip extension is attached. The chip extension underfill material can be thermally conductive or thermally insulative.

The invention also includes a method of containing TIM 120 in chip package 108 during thermal cycling and improving heat dissipation. The method includes providing a chip extension 150, 250, 350, 450 adjacent to chip 110, and placing TIM 120 between cooling structure 118 and chip 110 and chip extension 152. As noted above, chip extension 150 provides additional space for retaining TIM 120 during thermal cycling and additional heat spreading path(s) from chip 110.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A chip package comprising:
a chip;
a cooling structure directly coupled to the chip via a compliant thermal interface material; and
a chip extension thermally coupled and laterally adhered to at least one outer side surface of the chip, wherein the chip extension includes at least two discontinuous portions, further wherein a surface of the chip adjacent to the cooling structure and a surface of the chip extension adjacent to the cooling structure are co-planar.

2. The chip package of claim 1, wherein the chip extension is thermally conductive.

3. The chip package of claim 1, wherein the chip extension is coupled to the cooling structure via the thermal interface material.

4. The chip package of claim 1, wherein the chip extension includes a shape feature adjacent to a lower surface of the chip.

5. The chip package of claim 1, wherein an outer edge of the chip extension is ramped.

6. The chip package of claim 1, further comprising an adhesive filled region between the chip and the chip extension.

7. The chip package of claim 1, wherein the chip extension includes at least one of the following: silicon, copper, aluminum, copper-molybdenum, graphite, aluminum-silicon-carbide, tungsten carbide, aluminum nitride, beryllia, and diamond based composites.

8. A chip package comprising:
a substrate;
a chip mounted to the substrate;
a cooling structure directly coupled to the chip via a compliant thermal interface material; and
a thermally conductive chip extension thermally coupled and laterally adhered to at least one outer side surface of the chip and to the substrate, the chip extension also thermally coupled to the cooling structure via the thermal interface material, wherein the chip and the chip extension are co-planar, further wherein the chip extension includes at least two discontinuous portions.

9. The chip package of claim 8, wherein the chip extension includes a shape feature adjacent to a lower surface of the chip.

10. The chip package of claim 8, wherein an outer edge of the chip extension is ramped.

11. The chip package of claim 8, further comprising an adhesive filled region between the chip and the chip extension.

12. The chip package of claim 8, wherein the chip extension includes at least one of the following: silicon, copper, aluminum, copper-molybdenum, graphite, aluminum-silicon-carbide, tungsten carbide, aluminum nitride, beryllia, and diamond based composites.

* * * * *